(12) United States Patent
Sekiguchi et al.

(10) Patent No.: US 8,125,281 B2
(45) Date of Patent: Feb. 28, 2012

(54) RESONATOR

(75) Inventors: Ryota Sekiguchi, Kawasaki (JP);
Yasushi Koyama, Kamakura (JP)

(73) Assignee: Canon Kabushiki Kaisha, Tokyo (JP)

(*) Notice: Subject to any disclaimer, the term of this patent is extended or adjusted under 35 U.S.C. 154(b) by 37 days.

(21) Appl. No.: 12/731,004

(22) Filed: Mar. 24, 2010

(65) Prior Publication Data
US 2010/0244993 A1    Sep. 30, 2010

(30) Foreign Application Priority Data
Mar. 27, 2009    (JP) ................. 2009-079400

(51) Int. Cl.
*H03B 7/08*    (2006.01)
*H01P 7/10*    (2006.01)

(52) U.S. Cl. ............... 331/107 T; 331/117 D; 257/25; 333/219.1

(58) Field of Classification Search ........... 331/107 SL, 331/107 T, 117 D; 257/25; 333/219.1; 343/700 MS
See application file for complete search history.

(56) References Cited

U.S. PATENT DOCUMENTS

| | | | |
|---|---|---|---|
| 5,285,081 A * | 2/1994 | Ando | 257/24 |
| 5,981,969 A | 11/1999 | Yuan | |
| 7,274,263 B2 * | 9/2007 | Kazakov et al. | 331/107 SL |
| 7,881,352 B2 * | 2/2011 | Sekiguchi | 372/45.01 |
| 2006/0055476 A1 | 3/2006 | Kazakov | |
| 2007/0280319 A1* | 12/2007 | Sekiguchi et al. | 372/45.01 |
| 2010/0244994 A1* | 9/2010 | Sekiguchi et al. | 333/219.1 |

FOREIGN PATENT DOCUMENTS

JP    06-204504 A    7/1994
JP    2006-101495 A    4/2006

* cited by examiner

*Primary Examiner* — Levi Gannon
(74) *Attorney, Agent, or Firm* — Canon U.S.A., Inc. IP Division

(57) ABSTRACT

To provide a resonator that includes a resonant tunneling diode that can generate an electromagnetic wave. In the resonator, the resonant tunneling diode and a resistor layer are sandwiched between first and second conductors in a direction approximately perpendicular to the in-plane direction of the resonant tunneling diode. Further, the in-plane cross-sectional area of the resistor layer is larger than that of the resonant tunneling diode. Further, the width of the in-plane cross-sectional area of the resistor layer is more than twice as large as the skin depth of an electromagnetic wave to be caused to resonate.

19 Claims, 7 Drawing Sheets

RESONATOR

BACKGROUND OF THE INVENTION

1. Field of the Invention

The present invention relates to a resonator including a resonant tunneling diode (RTD) configured to generate an electromagnetic wave.

2. Description of the Related Art

It has been widely recognized that electronegative resistance elements include a resonator and can be applied for an electromagnetic wave generator. Hitherto, it has been recognized that the electronegative resistance element generates an electromagnetic wave (also referred to as a terahertz wave in this specification) including at least part of frequencies falling within a frequency band of from a millimeter wave band to a terahertz wave band inclusive (from 30 GHz to 30 THz inclusive).

As an example of the electronegative resistance elements, a monolithic resonator including a semiconductor substrate including the RTD, a microstrip conductor, and a grounding conductor, where the semiconductor substrate is sandwiched between the microstrip conductor and the grounding conductor, has been disclosed in Japanese Patent Laid-Open No. 2006-101495. A semi-insulating semiconductor substrate is used as a dielectric serving as an area defined to cause an electromagnetic wave generated through the resonant tunneling diode to resonate.

FIG. 7 is a sectional view illustrating the resonator disclosed in Japanese Patent Laid-Open No. 2006-101495. In the above-described resonator, a resonant tunneling diode hetero structure 10 is stacked on a semi-insulating semiconductor substrate 20. An insulation slab (dielectric) is provided between a microstrip 70 and a grounded metal 30 to cause an electromagnetic wave generated through the resonant tunneling diode to resonate. At that time, the microstrip 70 and a bias pad 60 are connected to the resonant tunneling diode hetero structure 10 through the use of contact layers 80, 90 so that an electrical contact with the resonant tunneling diode hetero structure 10 is achieved. Further, a capacitance is generated through the bias pad 60 and the grounded metal 30 (capacitive coupling). Consequently, an electromagnetic wave of the above-described frequency band can be caused to resonate through a resonator including the microstrip 70, the grounded metal 30, and the insulation slab 20 via the resonant tunneling diode. The above-described configuration allows for reducing a delay time (RC time constant) measured from when a voltage is applied to the resonant tunneling diode to when a current is output from the resonant tunneling diode.

SUMMARY OF THE INVENTION

As described above, Japanese Patent Laid-Open No. 2006-101495 has disclosed that a substrate is used as the resonator. At that time, a material that can be used as the substrate is limited by an RTD stacked on the substrate. Further, the thickness of the substrate should be relatively small in consideration of the frequency of an electromagnetic wave for oscillation. Therefore, the thickness of the substrate should be determined to make the substrate fragile.

From the viewpoint of the above-described manufacturing process, it has been difficult to select the thickness and/or the material of a dielectric included in the resonator through the technology disclosed in Japanese Patent Laid-Open No. 2006-101495. Therefore, there has been a limit to achieve a resonator configured to attain impedance matching with the resonant tunneling diode.

Further, a delay time (RC time constant) occurring in the resonant tunneling diode should be reduced as much as possible.

A resonator according to an embodiment of the present invention includes a resonant tunneling diode configured to generate an electromagnetic wave, a dielectric provided in contact with the resonant tunneling diode, a first conductor that doubles as an electrode configured to apply a current to the resonant tunneling diode and that is provided in electrical contact with the resonant tunneling diode, a resistor layer provided in series with the resonant tunneling diode in a direction approximately perpendicular to an in-plane direction of the resonant tunneling diode, and a second conductor that doubles as an electrode configured to apply a current to the resonant tunneling diode and that is provided in electrical contact with the resistor layer, wherein the resonant tunneling diode and the resistor layer are sandwiched between the first and second conductors in a direction approximately perpendicular to the in-plane direction of the resonant tunneling diode, wherein an in-plane cross-sectional area of the resistor layer is larger than an in-plane cross-sectional area of the resonant tunneling diode.

Further, a resonator according to another embodiment of the present invention includes a resonant tunneling diode configured to generate an electromagnetic wave, a resistor layer provided in series with the resonant tunneling diode, and first and second electrodes that are provided so that the resonant tunneling diode and the resistor layer are sandwiched between the first and second electrodes, wherein the resistor layer is configured so that a delay time acquired based on a capacitance of the resistor layer and the first electrode, and a resistance of the resistor layer becomes shorter than a cycle of the electromagnetic wave.

A resonator according to another embodiment of the present invention at least includes two conductors that are opposed to each other, and a resonant tunneling diode having a resonant tunneling structure layer provided in electrically contact with each of the two conductors via an electrical contact layer and a dielectric that are provided between the two conductors. The resonant tunneling diode includes a resistor layer stacked on the resonant tunneling structure layer, the in-plane cross-sectional area of the resistor layer is larger than the in-plane cross-sectional area of the resonant tunneling structure layer, and the resonator includes a part sandwiched between the conductor and the resistor layer, wherein a cross-sectional shape is attained where the smallest length that passes through the center of the in-plane cross section of the resistor layer and that connects the sides of the in-plane cross section of the resistor layer with each other is at least more than twice as large as the skin depth of an electromagnetic wave obtained in the resonator in a range where a delay time occurring in the resonant tunneling diode is shorter than a single cycle of the resonance frequency of the electromagnetic wave. According to an embodiment of the present invention, a resistor layer is provided between an RTD and a conductor so that a resonator can have an appropriate thickness. Further, a dielectric can be selected as a resonator according to an embodiment of the present invention. For example, a dielectric having a permittivity lower than that of a known semi-insulating substrate can be selected as the dielectric. Further, it becomes possible to select a dielectric having a relatively small dielectric loss within a frequency range of from a millimeter wave band to a terahertz wave band inclusive (from 30 GHz to 30 THz inclusive) as the above-described dielectric. At the same time, the resistor layer can be made to have a special cross-sectional shape to minimize a delay time. That is to say, the resistor layer allows for minimizing the series resistance of the resonant tunneling diode and reducing the stray capacitance (a parasitic capacitance occurring between the resistor layer and the conductor such as a parasitic capacitance 26 shown in FIG. 5B). Further, the delay time (RC time constant) can also be reduced through the above-described configuration. Consequently, the power (the product of a voltage and a current) is increased and the power of a terahertz wave for oscillation is increased.

A resonator having the above-described effects can be used for an oscillator that can oscillate an electromagnetic wave including at least part of frequencies falling within a frequency band of from a millimeter wave band to a terahertz wave band (from 30 GHz to 30 THz inclusive).

Further features of the present invention will become apparent from the following description of exemplary embodiments with reference to the attached drawings.

DESCRIPTION OF THE EMBODIMENTS

Figure 5A:
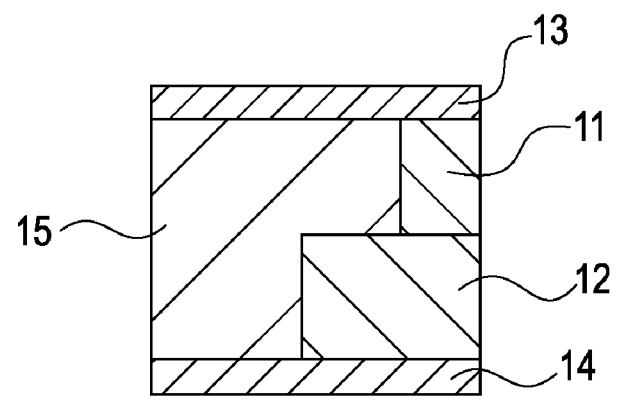
FIG. 5A is a schematic diagram showing the configuration of a resonator according to an embodiment of the present invention.
Figure 5B:
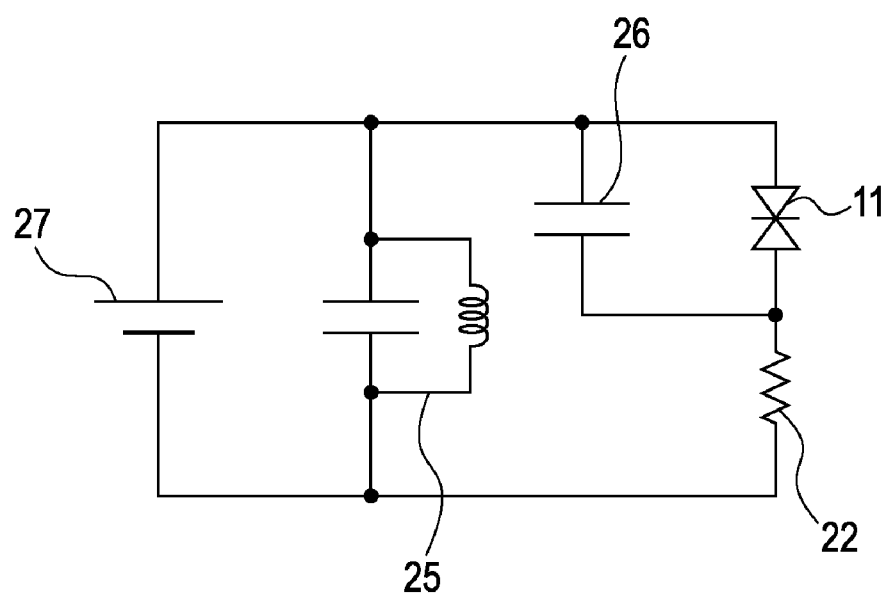
FIG. 5B is a schematic diagram showing a circuit equivalent to the configuration of the resonator.

A resonator according to an embodiment of the present invention will be described with reference to FIGS. 5A and 5B. Here, FIG. 5A is a schematic diagram illustrating the configuration of the resonator according to the above-described embodiment. FIG. 5B is a schematic diagram showing a circuit equivalent to the resonator according to the above-described embodiment.

First, a resonant tunneling diode (RTD) 11 is configured to generate an electromagnetic wave. The RTD 11 includes a resonant tunneling structure layer having a plurality of tunneling barrier layers, where a quantum well layer is provided between the tunneling barrier layers. Incidentally, it is preferable that the frequency of the electromagnetic wave fall within the frequency range of from 30 GHz to 30 THz inclusive.

Next, a resistor layer 12 is provided in series with the RTD 11 so that the resistor layer 12 is placed along a direction approximately perpendicular to the in-plane direction of the RTD 11. At that time, the resistor layer 12 functions as a resistor 22 placed in series with the RTD 11 in the equivalent circuit. The resistor 22 has a dependence on the material and/or the size (e.g., the cross-sectional area in the in-plane direction and the film thickness) of the resistor layer 12.

Further, a first conductor 13 doubles as an electrode applying a current to the RTD 11 and is in electrical contact with the RTD 11. A second conductor 14 doubles as another electrode applying a current to the RTD 11 and is in electrical contact with the resistor layer 12. The RTD 11 and the resistor layer 12 are sandwiched between the first and second conductors 13 and 14 in a direction approximately perpendicular to the in-plane direction of the RTD 11.

Here, it is preferable that a first electrical contact layer (a first contact layer 102 shown in FIG. 1C) be provided so as to be in contact with the resonant tunneling structure layer and the first conductor 13. Further, it is preferable that a second electrical contact layer (a second contact layer 103 shown in FIG. 1C) be provided so as to be in contact with the resonant tunneling structure layer and the resistor layer 12. Consequently, it becomes possible to control a current applied to the resonant tunneling structure layer.

A dielectric 15 can cause the generated electromagnetic wave to resonate. At that time, the dielectric 15 provided between the first conductor (a first electrode) 13 and the second conductor (a second electrode) 14 functions as a distributed constant resonator 25 in the equivalent circuit. At that time, the resistor layer 12 is configured so that a delay time (an RC time constant) acquired based on the capacitance (the parasitic capacitance 26) of the resistor layer 12 and the first conductor 13, and the resistance of the resistor layer 12 becomes shorter than the cycle of the electromagnetic wave caused to resonate. The delay time discussed in an embodiment of the present invention denotes the RC time constant acquired based on the product of the resistance and the capacitance (the parasitic capacitance 26).

Further, the in-plane cross-sectional area of the resistor layer 12 sandwiched between the first and second conductors 13 and 14 is larger than that of the RTD 11 to minimize the delay time (RC constant). Further, the width of the in-plane cross-sectional area of the resistor layer 12 is more than twice as large as the skin depth of the electromagnetic wave.

A power source (voltage applying unit) 27 shown in the equivalent circuit is provided in parallel with the RTD 11 to apply a current to the RTD 11 via the first and second conductors 13 and 14.

Further, it is preferable that the dielectric 15 be sandwiched between the first and second conductors 13 and 14, and be in contact with a face approximately perpendicular to the in-plane direction of the RTD 11.

First Embodiment

Figure 1A:
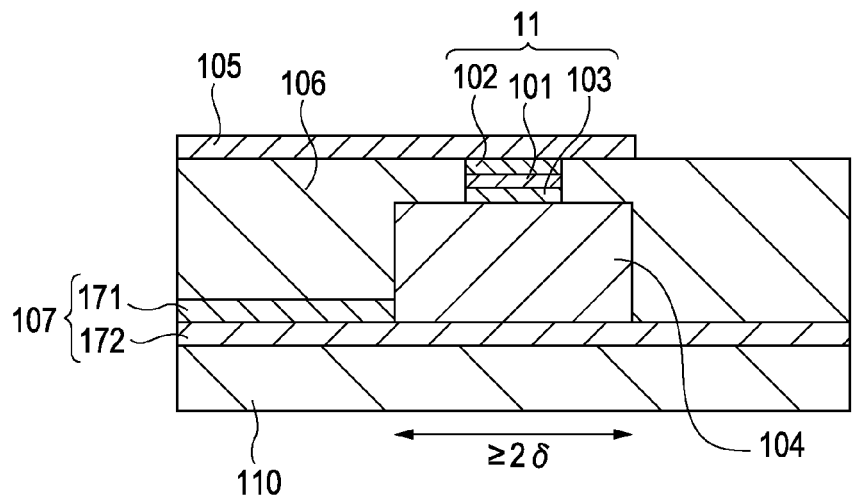
FIG. 1A is a schematic diagram showing the configuration of a resonator according to a first embodiment of the present invention.
Figure 1B:
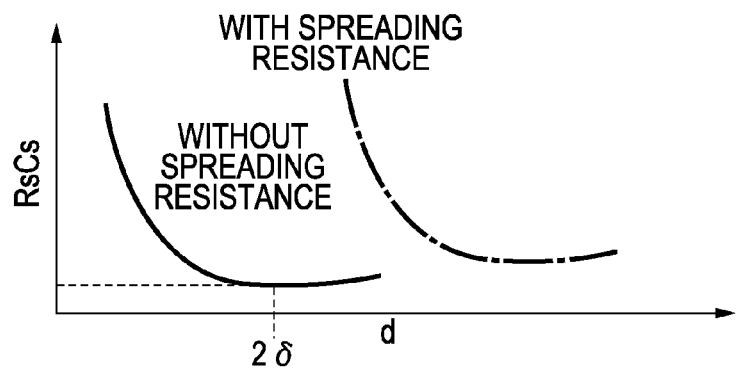
FIG. 1B is another schematic diagram showing the configuration of the resonator according to the first embodiment.
Figure 1C:
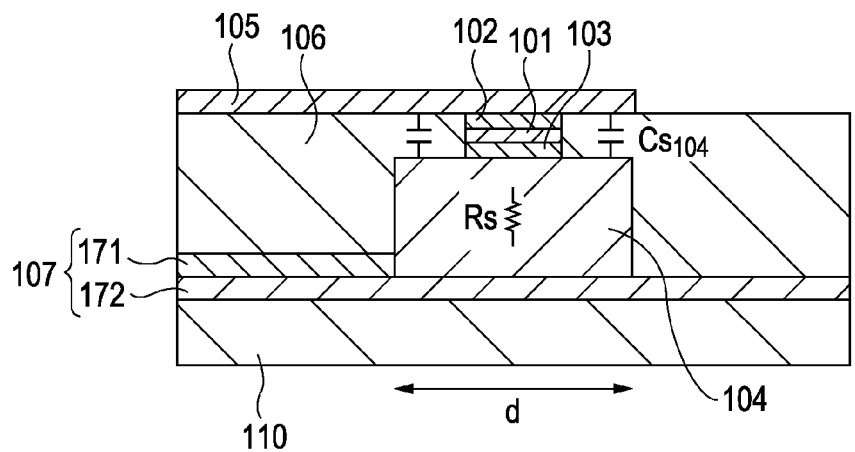
FIG. 1C is another schematic diagram showing the configuration of the resonator according to the first embodiment.

A resonator according to a first embodiment of the present invention will be described with reference to FIGS. 1A, 1B, and 1C. FIG. 1A shows a sectional view of the resonator of the first embodiment.

An RTD according to the first embodiment includes a resonant tunneling structure layer 101, the electrical contact layers 102 and 103 (first and second electrical contact layers 102 and 103) that are provided to apply a current to the resonant tunneling structure layer 101, and a resistor layer 104. The resonator of the first embodiment is sandwiched between two conductors 105 and 107 that are opposed to each other (first and second conductors 105 and 107). The resonant tunneling structure layer 101 is connected to a grounded metal 171 via a metal contact layer 172, and the conductor 107 (the grounded metal 171 and the grounded metal layer 172) doubles as a common electrode provided for a direct current (DC) and an alternating current (AC). Here, the conductor 105 (first conductor) serves as a bias pad and a microstrip. Accordingly, a resonator can be provided on a semiconductor substrate 110 having a resonant tunneling diode. The above-described configuration allows for causing an electromagnetic wave which falls within a frequency band defined in a frequency range of from a millimeter wave band to a terahertz wave band inclusive (from 30 GHz to 30 THz inclusive) to resonate through a resonator (including the two conductors 105 and 107, and the dielectric 106) via the resonant tunneling structure layer 101.

Accordingly, it becomes possible to adjust the thickness of the resonator based on the thickness of the resistor layer 104. The characteristic impedance of the microstrip 105 (first conductor) has a dependence on the thickness and the material of the dielectric 106. In an exemplary manner, the dielectric 106 is designed so that the thickness thereof is adequately smaller than the wavelength of the electromagnetic wave. It has been recognized that the characteristic impedance is increased with an increase in the thickness and is decreased with a decrease in the thickness. Further, it has been recognized that the characteristic impedance is increased with a decrease in the permittivity of the material and is decreased with an increase in the permittivity of the material (see Chapter 3 of "Transmission Line Design Handbook", ARTECH HOUSE INC (1991) by Brian C. Wadell). Thus, the resonator of the above-described embodiment of the present invention can select the material and/or the thickness of the dielectric so as to attain impedance matching with the RTD.

Further, according to a mesa-like cross-sectional shape attained in the above-described embodiment, the smallest length d that passes through the center of the in-plane cross section of the resistor layer 104 and that connects the sides of the in-plane cross section of the resistor layer 104 with each other is at least more than twice as large as the skin depth of an electromagnetic wave which is to be caused to resonate. Then, in an ideal state described below, it is preferable that the length d be approximately twice as large as the skin depth.

Japanese Patent Laid-Open No. 06-204504 has disclosed that the series resistance Rs of the RTD 11 can be adjusted based on the cross-sectional shape of the resistor layer 104. Japanese Patent Laid-Open No. 06-204504 has disclosed a logic element including a series load resistor (1 μm in diameter) and an RTD. Though not disclosed in Japanese Patent Laid-Open No. 06-204504, the operation frequency of the logic element falls within a relatively low frequency band equivalent to a few GHz or less. At that time, the value of a skin depth attained in the above-described frequency band is estimated to be from several tens of μm to several hundreds of μm, which is larger than the width (diameter) of the resistor disclosed in Japanese Patent Laid-Open No. 06-204504.

Considering the properties of a high frequency flowing near the surface, the length d of the resistor layer 104 should be more than twice as large as the skin depth δ to minimize the series resistance Rs. The above-described theory usually holds true for the case where the thickness in the stacking direction of the resistor layer 104 is larger than the skin depth δ. However, a parasitic stray capacitance $Cs_{104}$ occurs at a part sandwiched between the conductor 105 and the resistor layer 104 (FIG. 1C). The product $RsCs_{104}$ of the parasitic stray capacitance $Cs_{104}$ and the above-described series resistance Rs should be minimized. Namely, the cross-sectional area of the resistor layer 104 should not be unnecessarily large and the product $RsCs_{104}$ is minimized when the length d of the resistor layer 104 is exactly twice as large as the skin depth of an electromagnetic wave which is to be caused to resonate (FIG. 1B). Actually, a series resistance component referred to as a spreading resistance occurs in the resistor layer 104 (see Dickens, IEEE Trans. Microwave Theory and Techniques, Vol. MTT-15, 101 (1967)). Therefore, the minimization point of the RC time constant is shifted to the large area-side. If the shifted minimization point gains inclusion, the minimization point of the RC time constant appears in a cross-sectional shape attained when the length d of the resistor layer 104 is at least more than twice as large as the skin depth of the electromagnetic wave which is to be caused to resonate. As a matter of course, the maximum length d is limited so that the delay time (RC time constant) of the resonant tunneling diode does not exceed a single cycle of the resonance frequency of the electromagnetic wave.

It is known that the skin depth δ is approximately given as:

$$\delta = 1/\sqrt{(\pi\nu\mu\sigma)} \qquad \text{(Equation 1)},$$

and the skin depth δ has a dependence on the resonance frequency ν of the electromagnetic wave and/or the conductivity σ of the material of the resistor layer 104. Table 1 shows the relationships between the conductivities of several semiconductor materials and the skin depths δ determined based on the frequencies of electromagnetic waves, the frequencies being given as parameters. Here, referring to the effective mass and the mobility that are disclosed in "Semiconductors—Basic Data (2nd Rev. Ed.)" Springer (1996) by O. Madelung for the semiconductor materials, a conductivity having a dependence on a carrier concentration is derived based on Drude model which is well known to persons skilled in the art (the conductivity disclosed in "J. Crystal Grouth, Vol. 221, 59 (2000)" is consulted for GaAsSb marked with an asterisk). According to the resonator of the above-described embodiment, the resonant tunneling structure layer 101 is stacked on the semiconductor substrate 110. Therefore, it is assumed that the resistor layer 104 also includes a semiconductor material. As indicated by Expression 1, the skin depth δ also has a dependence on the frequency of the electromagnetic wave.

For example, as shown in Table 1, in a range of from a millimeter wave band to a terahertz wave band inclusive (from 30 GHz to 30 THz inclusive), the skin depth δ which is not unnecessarily large is attained for each of semiconductor materials. The materials of the above-described resistor layer 104, resonant tunneling structure layer 101, and electrical contact layers 102 and 103 that are used to apply a current to the resonant tunnel structure layer 101 may include GaAs/AlGaAs provided on a GaAs substrate and/or InGaAs/InAlAs and InGaAs/AlAs that are provided on an InP substrate. Further, without being limited to the above-described embodiment, a semiconductor multilayer film structure including InAs/AlAsSb and/or InAs/AlSb provided on an InAs substrate, InGaAs/AlGaAsSb provided on an InP substrate, Si/SiGe provided on a Si substrate, and so forth may be provided. As a majority carrier of the RTD 11, an electron and/or a positive hole may be selected by performing carrier doping for the electrical contact layers 102 and 103. The same selection is made to determine the conductivity type of the resistor layer 104.

TABLE 1

| Material | Concentration | Conductivity | δ (0.3 THz) μm | δ (1 THz) μm | δ (3 THz) μm |
| --- | --- | --- | --- | --- | --- |
| n-GaAs | $1 \times 10^{16}$ cm$^{-3}$ | $1.0 \times 10^{1}$ S/cm | 28 | 16 | 9 |
| n-GaAs | $1 \times 10^{18}$ cm$^{-3}$ | $4.8 \times 10^{2}$ S/cm | 4.2 | 2.3 | 1.3 |
| n-In$_{53}$Ga$_{47}$As | $1 \times 10^{17}$ cm$^{-3}$ | $1.3 \times 10^{2}$ S/cm | 8.1 | 4.4 | 2.6 |
| n-In$_{53}$Ga$_{47}$As | $1 \times 10^{18}$ cm$^{-3}$ | $9.6 \times 10^{2}$ S/cm | 3.0 | 1.6 | 0.9 |
| n-In$_{53}$Ga$_{47}$As | $1 \times 10^{19}$ cm$^{-3}$ | $6.4 \times 10^{3}$ S/cm | 1.1 | 0.63 | 0.36 |
| p-GaAs$_{51}$Sb$_{49}$* | $1 \times 10^{20}$ cm$^{-3}$ | $4.8 \times 10^{2}$ S/cm | 4.2 | 2.3 | 1.3 |
| n-InP | $1 \times 10^{16}$ cm$^{-3}$ | $6.4 \times 10^{0}$ S/cm | 36 | 20 | 11 |
| n-InP | $1 \times 10^{18}$ cm$^{-3}$ | $3.2 \times 10^{2}$ S/cm | 5.1 | 2.8 | 1.6 |

Second Embodiment: Microstrip Antenna

Figure 2A:
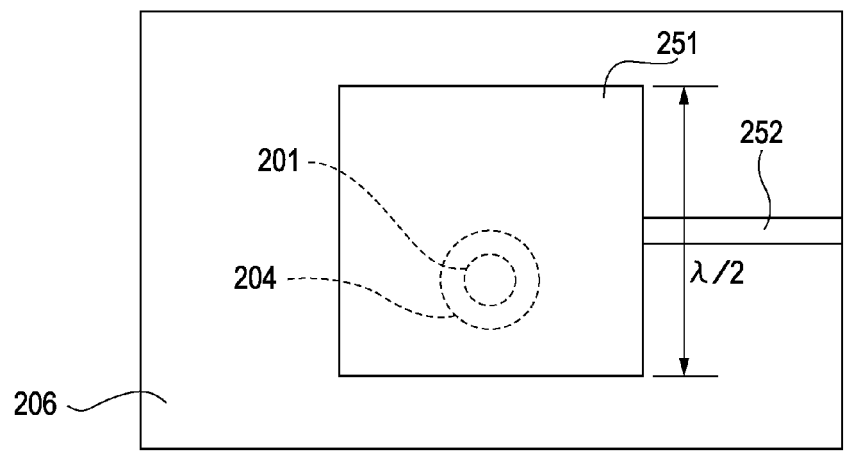
FIG. 2A is a schematic diagram showing the configuration of a resonator according to a second embodiment of the present invention.
Figure 2B:
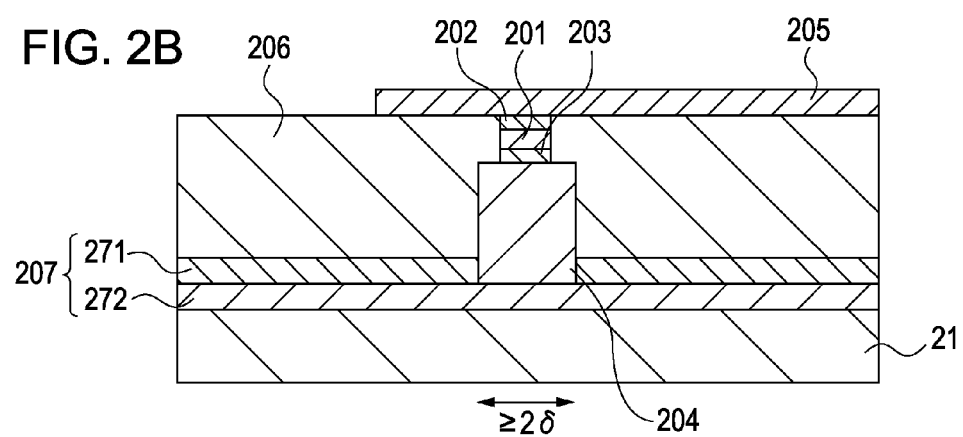
FIG. 2B is another schematic diagram showing the configuration of the resonator according to the second embodiment.
Figure 2C:
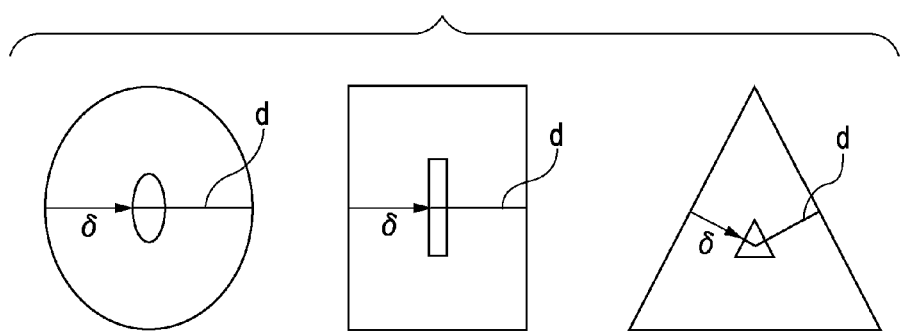
FIG. 2C is another schematic diagram showing the configuration of the resonator according to the second embodiment.

A resonator according to a second embodiment of the present invention will be described with reference to FIGS. 2A, 2B, and 2C. FIG. 2A is the top plan view of the resonator of the above-described embodiment and FIG. 2B is the sectional view of the resonator of the above-described embodiment.

The resonator of the above-described embodiment includes a patch antenna known as a microstrip antenna. The patch antenna is a distributed constant resonator (a resonator having a structure which is approximately as large as the resonant wavelength) and the resonance frequency thereof is determined based on the in-plane length of a patch antenna 251. Usually, a λ/2 patch antenna is used. An electromagnetic wave emitted from a resonant tunneling diode is caused to resonate with the patch antenna, and oscillates. Then, the electromagnetic wave can be taken outside through the use of the load on the patch antenna 251. Here, the specification of the load on the patch antenna 251 is determined based on an output to be taken out. In the above-described embodiment, the output to be taken out can be adjusted based on the thickness of a dielectric 206, that is, the thickness of the resistor layer 204. The input impedance corresponding to the resonance frequency of the patch antenna 251 is increased with an increase in the thickness of the dielectric 206, and is decreased with a decrease in the thickness of the dielectric 206. Further, the input impedance is increased with a decrease in the permittivity of the material of the dielectric 206 and is decreased with an increase in the permittivity of the material of the dielectric 206. Thus, the impedance of a resonator according to an embodiment of the present invention can be adjusted. Further, the input impedance can also be adjusted by offsetting the position of the RTD seen from above from the center of the antenna. Further, a bias line 252 is provided to apply a current to a resonant tunneling structure layer 201. The bias line 252 is connected to the power supply via a bias tee (a branch point provided in the circuit to pass a DC and an AC), for example.

In the above-described embodiment, a resistor layer 304 is circular in cross section. Here, the smallest length d passes through the center of the in-plane cross section of the resistor layer 304 and connects the sides of the in-plane cross section of the resistor layer 304 with each other. At that time, the length d becomes the length of the diameter of the circular cross section. This is because a current flows over almost the entire area of the resistor layer 304 when the length of the diameter is more than twice as large as the skin depth. The length d of a different cross-sectional shape is illustrated in FIG. 2C. When the cross-sectional shape is a triangle, the length d attains the orthocenter with reference to the center of the cross-sectional shape.

A hemispherical silicon lens may be placed on the top face of the resistor layer 304 as a coupling member used to couple the resistor layer 304 and the above-described patch antenna with an increased efficiency. Further, a horn antenna manufactured through micro-electro-mechanical-systems (MEMS) process may be placed on the top face of the resistor layer 304. The resonator of the above-described embodiment is appropriately used in a frequency band defined within a frequency range of from a millimeter wave band to a terahertz wave band inclusive (from 30 GHz to 30 THz inclusive).

Third Embodiment: Microstrip Filter

Figure 3A:
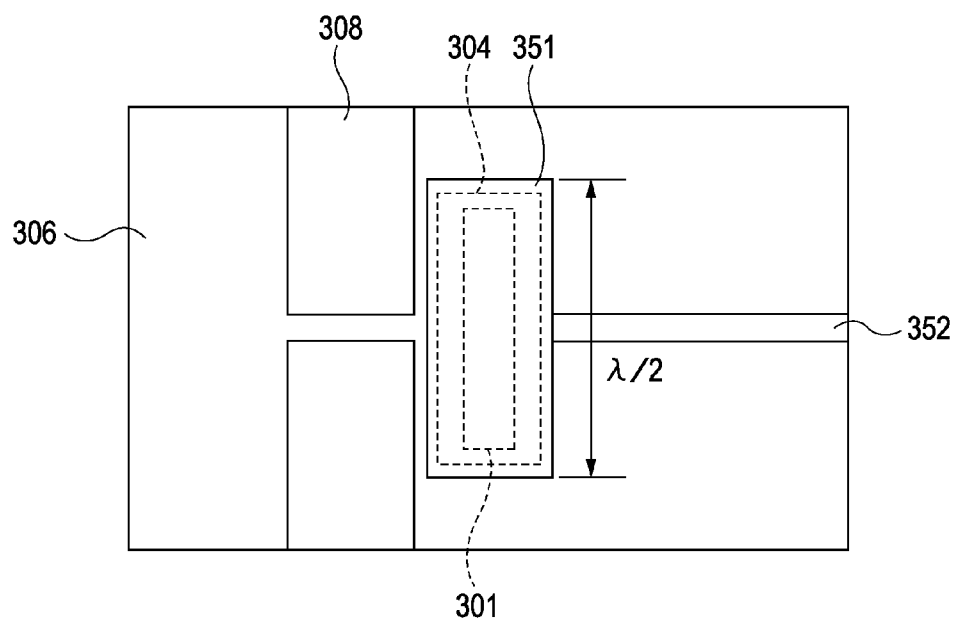
FIG. 3A is a schematic diagram showing the configuration of a resonator according to a third embodiment of the present invention.
Figure 3B:
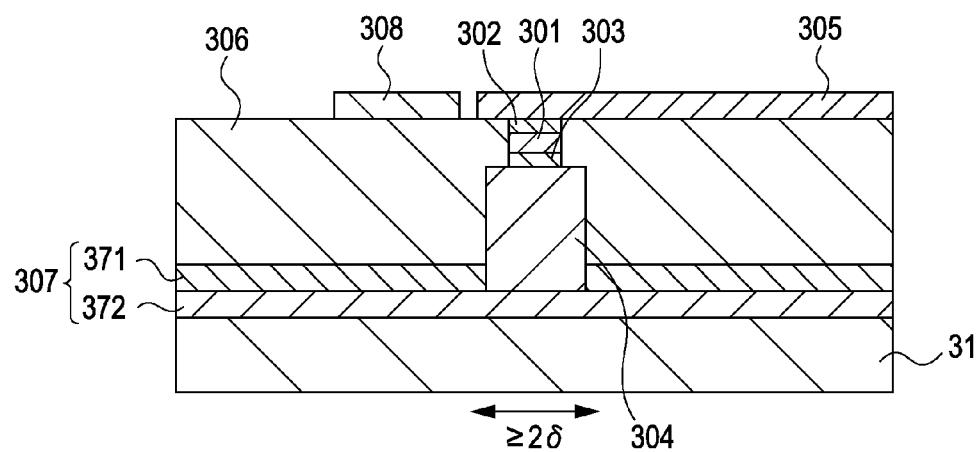
FIG. 3B is another schematic diagram showing the configuration of the resonator according to the third embodiment.

A resonator according to a third embodiment of the present invention will be described with reference to FIGS. 3A and 3B. FIG. 3A is a top plan view of the resonator of the above-described embodiment and FIG. 3B is a sectional view of the resonator of the above-described embodiment.

The resonator of the above-described embodiment includes a coupled-line filter known as a microstrip filter. The coupled-line filter is a distributed constant resonator and the resonance frequency thereof (specified frequency) is determined based on the in-plane length of a microstrip-line resonator 351. Usually, a λ/2 microstrip line is used. Further, two microstrip lines 308 are provided to have a magnetic field coupling with the λ/2 microstrip line. An electromagnetic wave emitted from a resonant tunneling diode is injection-synchronized with an electromagnetic wave transmitted to one of the microstrip lines 308 and oscillates. In this manner, an electromagnetic wave with an amplitude larger than that of the transmitted electromagnetic wave can be taken and transmitted to the other microstrip line 308. The above-described phenomenon is significant in a frequency band (specified frequency band) near the resonance frequency determined by the microstrip line resonator 351 so that the filter passes through the frequency band near the resonance frequency. Usually, the value of the characteristic impedance of the microstrip line 308 is 50Ω. Therefore, the value of the characteristic impedance of the microstrip line resonator 351 should be 50Ω or around. However, in an embodiment of the present invention, the characteristic impedance of the microstrip line resonator 351 can be adjusted based on the thickness of the dielectric 306, that is, the thickness of the resistor layer 304. The characteristic impedance of the microstrip line is increased with an increase in the thickness of the dielectric 306 and is decreased with a decrease in the thickness of the dielectric 306. Further, an adjustment can be made so that the characteristic impedance of the microstrip line is increased with a decrease in the permittivity of the material and is decreased with an increase in the permittivity of the material. Thus, the impedance of a resonator according to an embodiment of the present invention can be adjusted. A bias line 352 is provided to apply a current to a resonant tunneling structure layer 301. The bias line 352 is connected to the power supply or the like via a bias tee, for example.

In the above-described embodiment, the resistor layer 304 is square in cross section. Here, the smallest length d that passes through the center of the in-plane cross section of the resistor layer 304 and that connects the sides of the in-plane cross section of the resistor layer 304 with each other corresponds to the length of a short side of the square. This is because a current flows over almost the entire cross-sectional area of the resistor layer 304 when the length of the short side becomes exactly twice as large as the skin depth. The length d of a different cross-sectional shape is illustrated in FIG. 2C. When the cross-sectional shape is a triangle, the length d attains the orthocenter with reference to the center of the cross-sectional shape.

The resonator of the above-described embodiment is appropriately used in a frequency band defined within a frequency range of from a millimeter wave band to a terahertz wave band inclusive (from 30 GHz to 30 THz inclusive).

Fourth Embodiment

Figure 4:
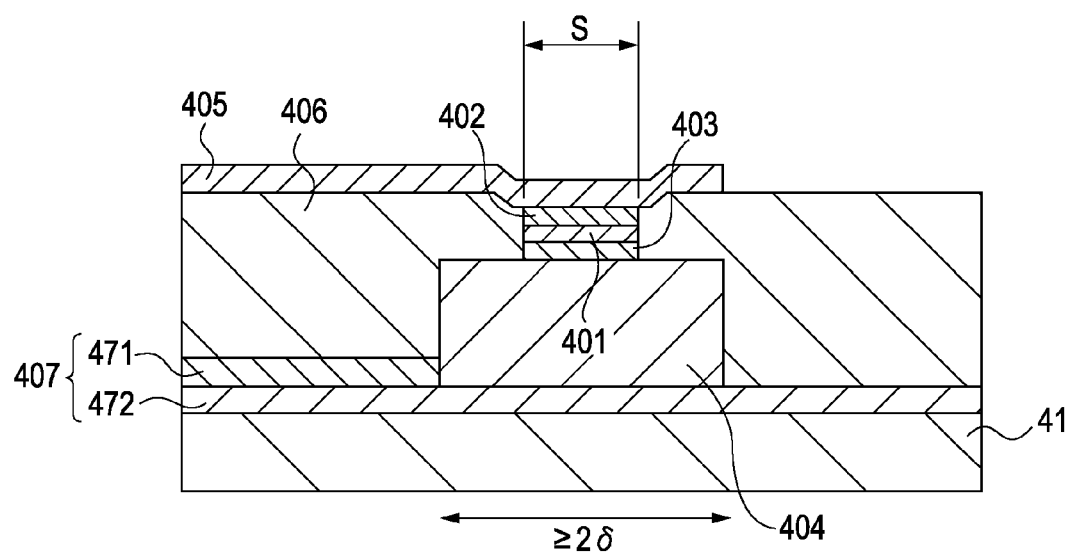
FIG. 4 is a schematic diagram showing the configuration of a resonator according to a fourth embodiment of the present invention.

A resonator according to a fourth embodiment of the present invention will be described with reference to FIG. 4.

The resonator of the above-described embodiment is optimized to reduce the RC time constant of an RTD. Here, the in-plane area of a resonant tunneling structure layer 401 provided in the RTD is determined to be an area $S_{401}$, and the in-plane area of a resistor layer 404 is determined to be an area $S_{404}$. In the above-described embodiment, a conductor 405 is deformed and the in-plane cross sectional area S of the conductor 405 is gradually brought close to the in-plane area $S_{401}$, because it is preferable that a part sandwiched between the conductor 405 and the resistor layer 404 be as large as possible in thickness to reduce a stray capacitance $Cs_{404}$. Further, for reducing a series resistance, the conductor 405 and an electrical contact layer 402 should not have unnecessarily small surface contact. The above-described embodiment has a configuration that can achieve both the thick part and the surface contact. Accordingly, on the contact face between the conductor 405 and the RTD, the in-plane cross-sectional area S has a shape indicated by the expression $S_{401} \leq S < S_{404}$.

In the above-described embodiment, a depression occurs in a microstrip 405. However, the electromagnetic properties of the resonator, which are attained when the depression is sufficiently shallow ($\lambda/2$ or less for example), are approximately the same as those attained when the microstrip 405 is smooth. Thus, the above-described embodiment allows for reducing the delay time occurring in the RTD without significantly changing the electromagnetic properties of the resonator.

The resonator of the above-described embodiment is appropriately used in a frequency band defined within a frequency range of from a millimeter wave band to a terahertz wave band inclusive (from 30 GHz to 30 THz inclusive).

More detailed configurations of the resonator will be described in the following embodiments.

Embodiments

Figure 6A:
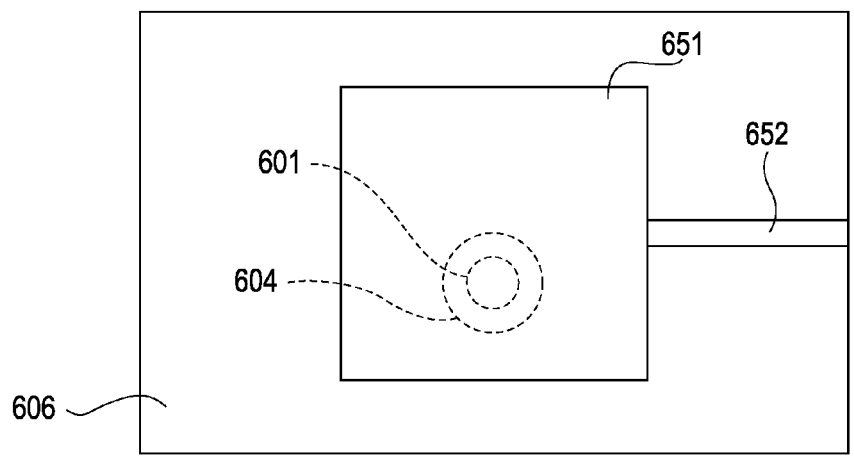
FIG. 6A is a schematic diagram showing the configuration of a resonator according to an embodiment of the present invention.
Figure 6B:
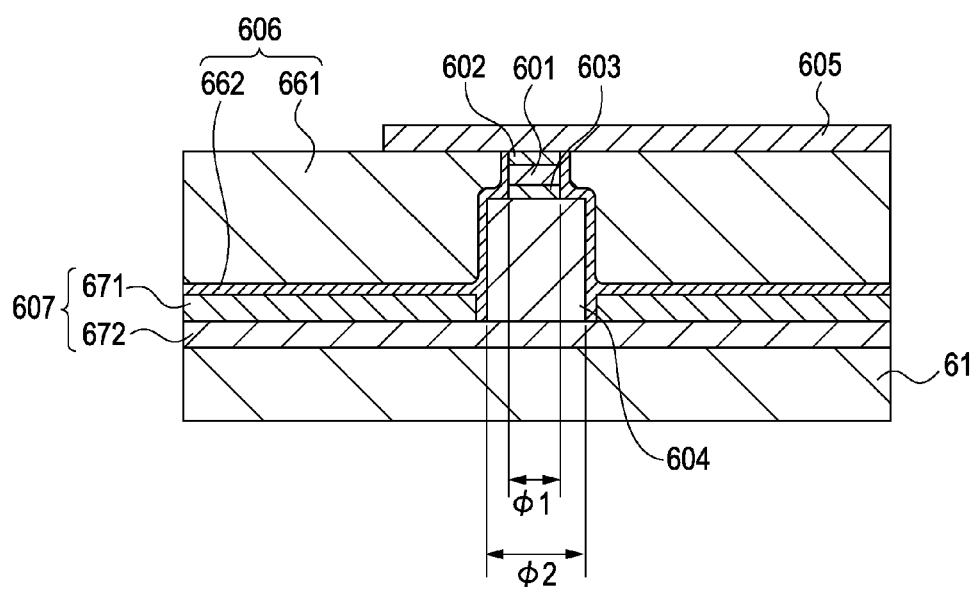
FIG. 6B is another schematic diagram showing the configuration of the resonator according to the embodiment.
Figure 7:
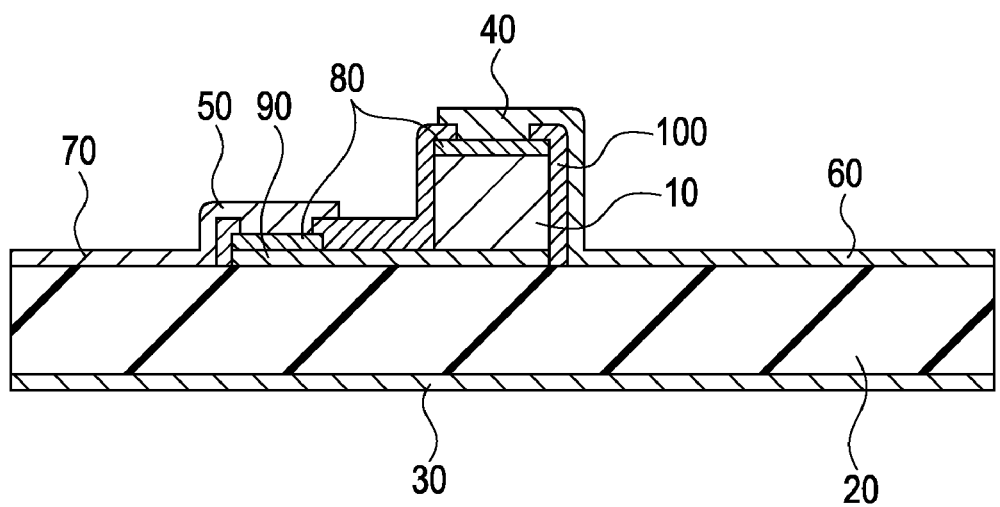
FIG. 7 is a schematic diagram showing the configuration of a resonator disclosed in Patent Document 1.

Each of FIGS. 6A and 6B shows a resonator according to an embodiment of the present invention. FIG. 6A is a top plan view of the configuration of the resonator and FIG. 6B is a sectional view of the configuration of the resonator. The resonator of the above-described embodiment includes a patch antenna well known as a microstrip antenna. A resonant tunneling diode of the above-described embodiment includes a resonant tunneling structure layer 601 including InGaAs/InAlAs and InGaAs/AlAs that are provided on an InP substrate, electrical contact layers 602 and 603 including n-InGaAs, and a resistor layer 604 including n-InP. The resonant tunneling structure layer 601 includes, for example, a resonant tunneling diode having three barrier layers. More specifically, the resonant tunneling structure layer 601 has a semiconductor multilayer film structure including AlAs having a thickness of 1.3 nm/InGaAs having a thickness of 7.6 nm/InAlAs having a thickness of 2.6 nm/InGaAs having a thickness of 5.6 nm/AlAs having a thickness of 1.3 nm that are stacked in that order from the electrical contact layer 602-side to the electrical contact layer 603-side. Of the above-described layers, the layer including InGaAs is a well layer, and the layer InAlAs attaining lattice matching and the layer AlAs attaining no matching are barrier layers. The above-described layers are not subjected to carrier doping deliberately, that is to say, the above-described layers are undoped. In the above-described embodiment, the resistor layer 604 has an electron concentration of about $5 \times 10^{18}$ cm$^{-3}$. The resonator of the above-described embodiment includes a benzocyclobutene (BCB) 661 provided between two conductors 605 and 607 that are opposed to each other, where the BCB is known as a low-loss dielectric having a relatively small dielectric loss within a frequency range of from a millimeter wave band to a terahertz wave band inclusive (from 30 GHz to 30 THz inclusive). The conductor 607 (a grounded metal 671 and a metal contact layer 672) doubles as a common electrode provided for a DC and an AC. However, in the above-described embodiment, the grounded metal 671 includes, for example, Ti/Au and the metal contact layer 672 includes n-Inp provided on an InP substrate 61. The conductor 607 also has an electron concentration of about $5 \times 10^{18}$ cm$^{-3}$. An n-type conductive substrate may be selected as the InP substrate 61. In that case, the conductive InP substrate 61 may double as the resistor layer 604 and the metal contact layer 672. In the above-described embodiment, a square-shaped patch 651 with 200 µm sides is selected as the patch antenna. Further, in the above-described embodiment, the patch antenna 651 has a load of 50Ω to match with a relatively low-impedance resonant tunneling diode. Therefore, the BCB 661 should have a film thickness of about 3 µm. Consequently, the film thickness of the resistor layer 604 is determined to be 3 µm. Further, the position of the RTD seen from above is offset from the center of the antenna in the resonance direction by as much as 40 µm so that the input impedance is further adjusted. When the resonant tunneling structure layer 601 of the above-described patch antenna 651 is 2 µm in diameter, the value of an oscillation frequency is estimated to be 0.4 THz or around.

The skin depth δ of the resistor layer 604 of the above-described embodiment becomes 2 µm when an oscillation frequency of 0.4 THz is obtained, so that the minimum diameter 2δ of the resistor layer 604 becomes 4 µm, which attains an ideal state where the spread resistance of the resistor layer 604 has a value of zero. However, considering the spread resistance of the above-described embodiment, it is estimated that the minimization point of the RC time constant is attained when the resistor layer 604 is 10 µm in diameter. In the above-described embodiment, the series resistance Rs is estimated to be 1.6Ω and the parasitic stray capacitance $Cs_{604}$ of the part sandwiched between the conductor 605 and the resistor layer 604 is estimated to be several tens of fF. As a matter of course, the value of the time constant $RsCs_{604}$ is smaller than a single cycle (2.5 psec) of an oscillation frequency of 0.4 THz.

Thus, the resonator of the above-described embodiment can be used as a resonator that can take an electromagnetic wave with a frequency which falls within a frequency range of from a millimeter wave band to a terahertz wave band inclusive (from 30 GHz to 30 THz inclusive) outside.

The resonator of the above-described embodiment can be manufactured according to the following manufacturing methods. First, the next layer is epitaxially grown on the InP substrate 61 according to the molecular beam epitaxy (MBE) method and/or the metalorganic vapor phase epitaxy (MOVPE) method. That is to say, the n-InP 672, the n-InP 604, the n-InGaAs 603, the resonant tunneling structure layer 601 including the undoped InGaAs/InAlAs, and the n-InGaAs 602 are epitaxially grown in that order. When the n-type conductive substrate is selected as the InP substrate 61, the layer growing should be started from the n-InGaAs 603. Next, the resonant tunneling structure layer 601, and the electrical contact layers 602 and 603 are etched to form a mesa indicated by the equation Φ1=2 μm. Further, the resistor layer 604 is etched to form a mesa indicated by the equation Φ2=10 μm. The above-described etching is achieved according to a dry etching method performed through photolithography and inductively coupled plasma (ICP). Next, the grounded metal 671 is formed on the face of the exposed n-InP 672 according to the lift-off method. A passivation film 662 provided to protect the sidewall of the resonant tunneling structure layer 601 is formed by using silicon nitride according to, for example, the plasma chemical-vapor deposition (CVD) method. On a part by which the resonator is provided, the part being secured by determining the film thickness of the resistor layer 604 to be 3 μm, the BCB 661 is formed to have a film thickness of about 3 μm according to the spin coating method and the dry etching method so that the n-InGaAs 602 is exposed. Finally, the Ti/Pd/Au 605 is formed according to the lift-off method so that the resonator of the above-described embodiment is completed.

The above-described embodiment allows for attaining the above-described influences and/or effects clarified in the above-described embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-079400 filed on Mar. 27, 2009, which is hereby incorporated by reference herein in its entirety.

What is claimed is:

1. A resonator comprising:
a resonant tunneling diode configured to generate an electromagnetic wave;
a dielectric provided in contact with the resonant tunneling diode;
a first conductor that doubles as an electrode configured to apply a current to the resonant tunneling diode and that is provided in electrical contact with the resonant tunneling diode;
a resistor layer provided in series with the resonant tunneling diode in a direction approximately perpendicular to an in-plane direction of the resonant tunneling diode; and
a second conductor that doubles as an electrode configured to apply a current to the resonant tunneling diode and that is provided in electrical contact with the resistor layer,
wherein the resonant tunneling diode and the resistor layer are sandwiched between the first and second conductors in a direction approximately perpendicular to the in-plane direction of the resonant tunneling diode,
wherein an in-plane cross-sectional area of the resistor layer is larger than an in-plane cross-sectional area of the resonant tunneling diode.

2. The resonator according to claim 1,
wherein a width of the in-plane cross-sectional area of the resistor layer is more than twice as large as a skin depth of the electromagnetic wave.

3. The resonator according to claim 1, wherein the resistor layer is configured to have a delay time shorter than a cycle of the electromagnetic wave.

4. The resonator according to claim 3, wherein the delay time is acquired based on a product of a capacitance of the first conductor and the resistor layer, and a resistance of the resistor layer.

5. The resonator according to claim 1, wherein the dielectric is sandwiched between the first and second conductors, and is in contact with a face perpendicular to the in-plane direction of the resonant tunneling diode.

6. The resonator according to claim 2, wherein a thickness of the resistor layer, the thickness being defined along a direction approximately perpendicular to an in-plane direction of the resistor layer, is larger than the skin depth of the electromagnetic wave.

7. The resonator according to claim 1, wherein the resonator is a microstrip antenna configured to emit the electromagnetic wave.

8. The resonator according to claim 1, wherein the resonator is a microstrip filter configured to pass through a specified frequency band of the electromagnetic wave.

9. The resonator according to claim 1, wherein, on an electrical contact face defined between the first conductor and the resonant tunneling diode, an in-plane cross-sectional area of the first conductor is larger than an in-plane cross-sectional area of a resonant tunneling structure layer and is smaller than the in-plane cross-sectional area of the resistor layer.

10. The resonator according to claim 1, wherein a frequency of the electromagnetic wave falls within a frequency range of from 30 gigahertz to 30 terahertz inclusive.

11. The resonator according to claim 1, wherein the resonant tunneling diode includes a resonant tunneling structure layer including a plurality of tunneling barrier layers and an electrical contact layer provided to apply a current to the resonant tunneling structure layer.

12. A resonator comprising:
a resonant tunneling diode configured to generate an electromagnetic wave;
a resistor layer provided in series with the resonant tunneling diode; and
first and second electrodes that are provided so that the resonant tunneling diode and the resistor layer are sandwiched between the first and second electrodes,
wherein the resistor layer is configured so that a delay time acquired based on a capacitance of the resistor layer and the first electrode, and a resistance of the resistor layer becomes shorter than a cycle of the electromagnetic wave.

13. The resonator according to claim 12, further comprising a voltage applying unit that is provided in parallel with the resonant tunneling diode and that is configured to apply a current to the resonant tunneling diode via the first and second electrodes.

14. The resonator according to claim 12 wherein an in-plane cross-sectional area of the resistor layer is larger than an in-plane cross-sectional area of the resonant tunneling diode.

15. The resonator according to claim 14,
wherein a width of the in-plane cross-sectional area of the resistor layer is more than twice as large as a skin depth of an electromagnetic wave.

16. The resonator according to claim 15, wherein a thickness of the resistor layer, the thickness being defined along a direction approximately perpendicular to an in-plane direction of the resistor layer, is larger than the skin depth of the electromagnetic wave.

17. The resonator according to claim 12, wherein the resonator is a microstrip antenna configured to emit the electromagnetic wave.

18. The resonator according to claim 12, wherein the resonator is a microstrip filter configured to pass through a specified frequency band of the electromagnetic wave.

19. The resonator according to claim 12, wherein the resistor layer provided in series with the resonant tunneling diode is in a direction approximately perpendicular to an in-plane direction of the resonant tunneling diode.

* * * * *